United States Patent
Krasnov

(10) Patent No.: US 7,597,964 B2
(45) Date of Patent: Oct. 6, 2009

(54) THERMALLY TEMPERED COATED ARTICLE WITH TRANSPARENT CONDUCTIVE OXIDE (TCO) COATING

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 11/194,730

(22) Filed: Aug. 2, 2005

(65) Prior Publication Data
US 2007/0031682 A1 Feb. 8, 2007

(51) Int. Cl.
*B32B 17/06* (2006.01)

(52) U.S. Cl. .................. 428/432; 428/426; 428/428; 428/448; 428/689; 428/699; 428/701; 428/702

(58) Field of Classification Search .................. 428/432
See application file for complete search history.

(56) References Cited

U.S. PATENT DOCUMENTS

| | | | |
|---|---|---|---|
| 2,564,706 A * | 8/1951 | Mochel ................. 338/308 |
| 3,762,902 A * | 10/1973 | Wagner et al. ........... 65/60.2 |
| 3,951,634 A | 4/1976 | Hall et al. |
| 3,973,942 A | 8/1976 | Coen et al. |
| 4,004,901 A | 1/1977 | Starr |
| 4,046,543 A | 9/1977 | Shields |
| 4,378,406 A * | 3/1983 | Laitinen et al. ........... 428/336 |
| 4,433,993 A | 2/1984 | Frank |
| 4,437,872 A | 3/1984 | McMaster et al. |
| 4,946,491 A | 8/1990 | Barr |
| 5,135,581 A * | 8/1992 | Tran et al. ............... 136/256 |
| 5,232,482 A | 8/1993 | Laakso et al. |
| 5,304,499 A | 4/1994 | Bonnet et al. |
| 5,387,433 A | 2/1995 | Balian et al. |
| 5,443,609 A | 8/1995 | Lehto |
| 5,543,229 A * | 8/1996 | Ohsaki et al. ............. 428/432 |
| 5,735,922 A | 4/1998 | Woodward et al. |
| 5,735,923 A | 4/1998 | Hisaeda |
| 5,755,845 A | 5/1998 | Woodward et al. |
| 5,827,345 A | 10/1998 | Boaz et al. |
| 5,868,871 A | 2/1999 | Yokose et al. |
| 5,871,843 A * | 2/1999 | Yoneda et al. ............ 428/337 |
| 5,893,941 A | 4/1999 | Nikander |
| 5,922,142 A | 7/1999 | Wu et al. |
| 5,928,398 A | 7/1999 | Lehto |
| 5,938,810 A | 8/1999 | DeVries, Jr. et al. |
| 5,951,734 A | 9/1999 | Friedel et al. |
| 5,974,834 A | 11/1999 | Rijkens et al. |
| 6,169,246 B1 | 1/2001 | Wu et al. |
| 6,221,495 B1 | 4/2001 | Wu et al. |
| 6,231,971 B1 * | 5/2001 | Terneu et al. ............. 428/336 |
| 6,251,701 B1 | 6/2001 | McCandless |

(Continued)

*Primary Examiner*—Ling Xu
(74) *Attorney, Agent, or Firm*—Nixon & Vanderhye P.C.

(57) ABSTRACT

A method of making a coated article including a transparent conductive oxide (TCO) film supported by a tempered glass substrate is provided. Initially, an amorphous metal oxide film is sputter-deposited onto a non-tempered glass substrate, either directly or indirectly. The glass substrate with the amorphous film thereon is then thermally tempered using high temperatures. The thermal tempering causes the amorphous film to be transformed into a crystalline transparent conductive oxide (TCO) film. The heat used in the thermal tempering of the glass substrate causes the amorphous film to turn into a crystalline film, causes the visible transmission of the film to increase, and/or causes the film to become electrically conductive.

7 Claims, 2 Drawing Sheets

U.S. PATENT DOCUMENTS

| | | |
|---|---|---|
| 6,261,693 B1 | 7/2001 | Veerasamy |
| 6,436,541 B1 | 8/2002 | Sopko et al. |
| 6,602,606 B1 | 8/2003 | Fujisawa et al. |
| 6,797,388 B1 * | 9/2004 | Szanyi et al. ............... 428/432 |
| 6,809,023 B2 | 10/2004 | Arai et al. |
| 6,849,328 B1 | 2/2005 | Medwick et al. |
| 2002/0035852 A1 | 3/2002 | Wang et al. |
| 2003/0177792 A1 | 9/2003 | Longobardo et al. |
| 2003/0186144 A1 | 10/2003 | Kuneida et al. |
| 2004/0151895 A1 | 8/2004 | Itoh et al. |
| 2004/0180216 A1 | 9/2004 | Veerasamy et al. |
| 2005/0048284 A1 | 3/2005 | Veerasamy |
| 2005/0095431 A1 | 5/2005 | Veerasamy |
| 2006/0081993 A1 * | 4/2006 | Thiel .......................... 257/762 |

* cited by examiner

THERMALLY TEMPERED COATED ARTICLE WITH TRANSPARENT CONDUCTIVE OXIDE (TCO) COATING

This invention relates to a method of making a thermally tempered coated article including a transparent conductive oxide (TCO) film supported by a tempered glass substrate. A coated article, that is thermally tempered and made by such a process, is also provided. Coated articles according to certain example non-limiting embodiments of this invention may be used in applications such as solar cells, oven doors, defrosting windows, or other types of windows in certain example instances.

BACKGROUND AND SUMMARY OF EXAMPLE EMBODIMENTS OF INVENTION

Typically, methods of forming TCOs on glass substrates require high glass substrate temperatures. Such methods include chemical pyrolysis where precursors are sprayed onto the glass substrate at approximately 400 to 500 degrees C., and vacuum deposition where the glass substrate is kept at about 150 to 300 degrees C. Unfortunately, TCO films such as $SnO_2$:F (fluorine doped tin oxide) formed on glass substrates by chemical pyrolysis suffer from non-uniformity and thus may be unpredictable and/or inconsistent with respect to certain optical and/or electrical properties.

Sputter deposition of a TCO (transparent conductive oxide) at approximately room temperature would be desirable, given that most float glass manufacturing platforms are not equipped with in-situ heating systems. An additional potential advantage of sputter-deposited TCO films is that they may include the integration of anti-reflection coatings, resistivity reduction, and so forth.

There is often a need to thermally temper coated articles having a glass substrate coated with a TCO film/coating. For instance, in certain applications tempering is required by code (e.g., for windows over doorways, for windows identified as breakable windows for firemen, and other applications). Thermal tempering typically requires heating the glass substrate with a coating thereon in a tempering furnace at a temperature of at least about 580 degrees C., more preferably at least about 600 degrees C., and often at least about 620 or 640 degrees C. (e.g., for at least about 2 minutes, more preferably for at least about 5 minutes). Thus, it will be appreciated that thermal tempering involves very high temperatures.

Unfortunately, it has been found that glass substrates supporting sputter-deposited TCOs cannot be thermally tempered without the TCOs suffering a significant loss in electrical conductivity. Glass tempering temperatures (see above) of typical sputter-deposited films causes a rapid conductivity drop in certain TCOs (e.g., sputter-deposited zinc oxide inclusive TCOs).

Thus, it will be appreciated that there exists a need in the art for an improved technique or method of tempering glass substrates including a film/coating thereon that can result in an effective and/or efficient tempered glass substrate with a TCO film thereon.

In certain example embodiments of this invention, a method is provided for making a thermally tempered coated article including a tempered glass substrate with a TCO film thereon. Initially, an amorphous metal oxide film is sputter-deposited onto a non-tempered glass substrate, either directly or indirectly. In certain example embodiments, the sputter-deposited amorphous metal oxide film may be of or include an oxide of Sn and/or Sb (e.g., $SnO_x$:Sb). As sputter-deposited, the metal oxide film is rather high with respect to visible light absorption, has a high sheet resistance (i.e., not truly conductive), and is amorphous. The glass substrate with the amorphous film thereon is then thermally tempered. The thermal tempering typically involves heating the glass substrate with the amorphous film thereon in a tempering furnace at a temperature of at least about 580 degrees C., more preferably at least about 600 degrees C., and often at least about 620 or 640 degrees C. The glass substrate with the film thereon may be in the tempering furnace for at least about 2 minutes, more preferably for at least about 5 minutes, in certain example embodiments of this invention. The thermal tempering causes the amorphous non-conductive film to be transformed into a crystalline transparent conductive oxide (TCO) film. In other words, the heat used in the thermal tempering of the glass substrate causes the amorphous film to turn into a crystalline film, causes the visible transmission of the film to increase, and causes the film to become electrically conductive. In short, the thermal tempering activates the film.

In certain example embodiments of this invention, the amorphous film prior to tempering and the crystalline TCO following tempering may be of or include $SnO_x$:Sb (x may be from about 0.5 to 2, more preferably from about 1 to 2, and sometimes from about 1 to 1.95). The film may be oxygen deficient (substoichiometric in certain instances). The Sn and Sb may be co-sputtered in an oxygen inclusive atmosphere (e.g., a mixture of oxygen and argon) to form the film in certain example embodiments of this invention, with the Sb being provided to increase conductivity of the crystalline film following tempering. In certain example embodiments, the Sb is provided for doping purposes, and can make up from about 0.001 to 30% (weight %) of the amorphous and/or crystalline metal oxide film (from preferably from about 1 to 15%, with an example being about 8%). If the Sb content is higher than this, the lattice is disturbed too much and mobility of electrons is also disturbed thereby hurting conductivity of the film, whereas if less than this amount of Sb is provided then the conductivity is not as good in the crystalline film.

In certain example embodiments of this invention, there is provided a method of making a thermally tempered coated article including a transparent conductive film on a tempered glass substrate, the method comprising: providing a glass substrate; sputter-depositing an amorphous film comprising Sn and Sb on the glass substrate; thermally tempering the glass substrate with the amorphous film comprising Sn and Sb thereon; and wherein heat used in said tempering causes the amorphous film to transform into a crystalline film, and wherein the crystalline film is transparent to visible light and electrically conductive.

In other example embodiments of this invention, there is provided a method of making a thermally tempered coated article including a transparent conductive film on a tempered glass substrate, the method comprising: providing a glass substrate; sputter-depositing an amorphous film on the glass substrate; thermally tempering the glass substrate with the amorphous film thereon; and wherein heat used in said tempering causes the amorphous film to transform into a crystalline film, and wherein the crystalline film is transparent to visible light and electrically conductive.

In still further example embodiments of this invention, there is provided a coated article comprising: a thermally tempered glass substrate; and a crystalline transparent conductive film comprising a metal oxide supported by at least the tempered glass substrate, and wherein the transparent conductive film comprises Sn and Sb, and has an Sb content of from about 0.001 to 30%.

DETAILED DESCRIPTION OF EXAMPLE EMBODIMENTS OF THE INVENTION

Coated articles including conductive layer(s) according to certain example non-limiting embodiments of this invention may be used in applications such as solar cells, oven doors, defrosting windows, display applications, or other types of windows in certain example instances. For example and without limitation, the transparent conductive layers discussed herein may be used as electrodes in solar cells, as heating layers in defrosting windows, as solar control layers in windows, and/or the like.

Figure 1:
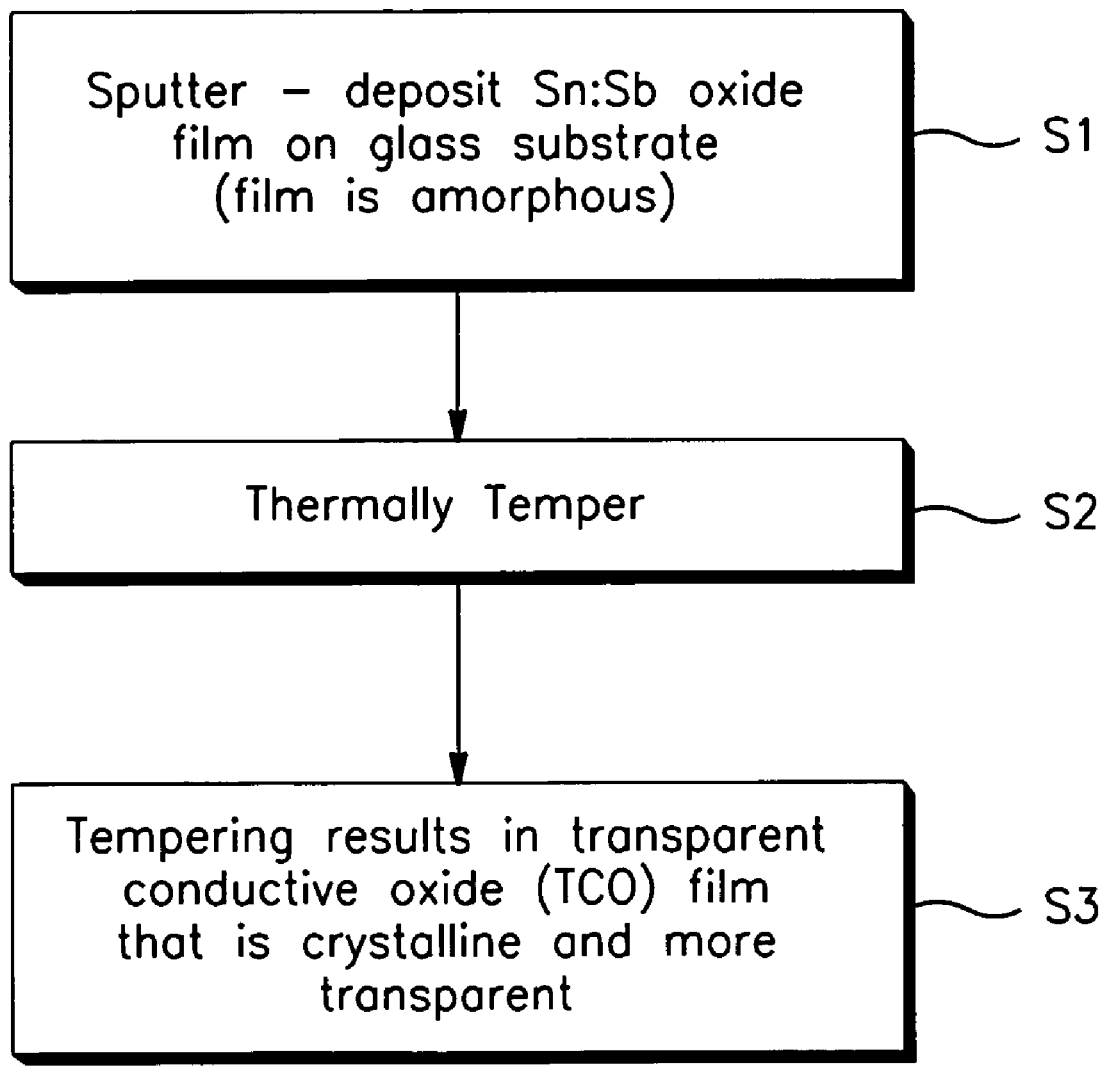
FIG. 1 is a flowchart illustrating a method of making a thermally tempered coated article according to an example embodiment of this invention.
Figure 2:
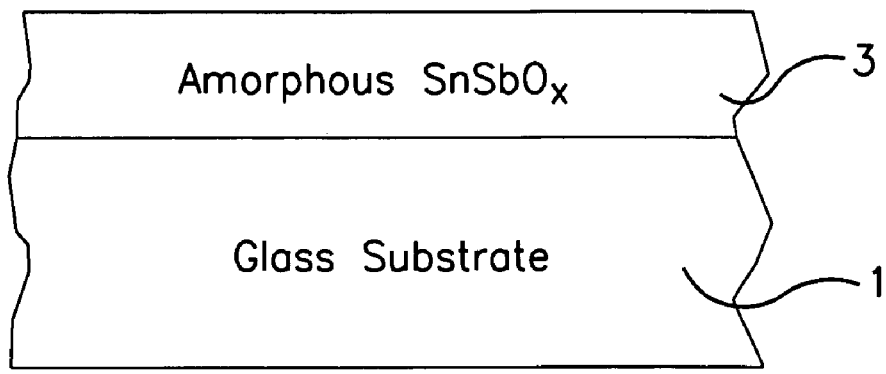
FIG. 2 is a schematic diagram illustrating the method of FIG. 1 using cross sectional views according to an example embodiment of this invention.
Figure 2:
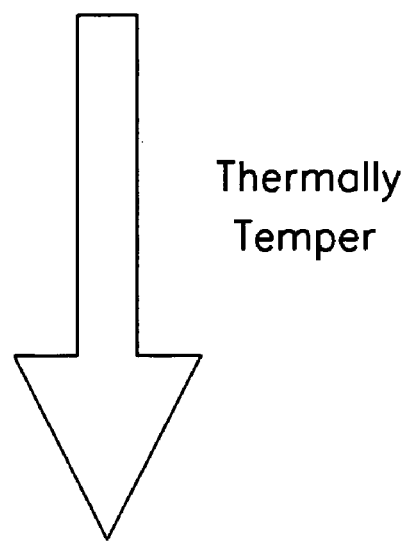
Figure 2:
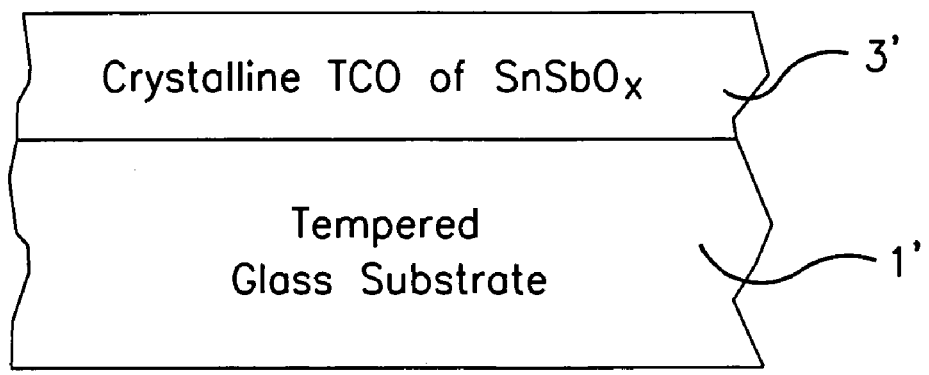

FIG. 1 is a flowchart illustrating certain steps performed in making a coated article according to an example embodiment of this invention, whereas FIG. 2 illustrates this example embodiment in terms of a cross sectional schematic view.

Referring to FIGS. 1-2, an example of this invention will be described. Initially, an amorphous metal oxide film 3 is sputter-deposited onto a non-tempered glass substrate 1 (S1 in FIG. 1). It is possible that other layer(s) may be provided on the substrate 1 under film 3, although the film 3 may be deposited directly onto the substrate in certain example embodiments. The film 3 is considered "on" and "supported by" the substrate 1 regardless of whether other layer(s) are provided therebetween. In certain example embodiments, the sputter-deposited amorphous metal oxide film 3 may be of or include an oxide of Sn and/or Sb (e.g., $SnO_x$:Sb). As sputter-deposited, the metal oxide film 3 may have a visible light transmission of less than 70%, may have a rather high sheet resistance (i.e., not be truly conductive), and is amorphous.

Following step S1, the glass substrate 1 with the amorphous film 3 thereon is thermally tempered (S2 in FIG. 1). The thermal tempering typically involves heating the glass substrate 1 with the amorphous film 3 thereon in a tempering furnace at a temperature of at least about 580 degrees C., more preferably at least about 600 degrees C., and often at least about 620 or 640 degrees C. The glass substrate 1 with the film 3 thereon may be in the tempering furnace for at least about 2 minutes, more preferably for at least about 5 minutes, in certain example embodiments of this invention. The heat used during the thermal tempering causes the amorphous non-conductive film 3 to be transformed into a crystalline transparent conductive oxide (TCO) film 3'. In other words, the heat used in the thermal tempering of the glass substrate 1 causes the amorphous film 3 to turn into a crystalline film 3', causes the visible transmission of the film to increase (e.g., to a level above 70%), and causes the film to become electrically conductive. In short, the thermal tempering activates the film so that TCO film 3' is provided following the tempering.

In certain example embodiments, the thermal tempering causes the visible transmission of the film 3 to increase by at least about 5%, more preferably by at least about 10%. In certain example embodiments, the thermal tempering causes the sheet resistance ($R_s$) of the film 3 to drop by at least about 20 ohms/square, more preferably by at least about 50 ohms/square, and most preferably by at least about 100 ohms/square. Electrical conductivity can be measured in terms of sheet resistance ($R_s$). The TCO films 3' discussed herein (following the tempering) have a sheet resistance ($R_s$) of no greater than about 200 ohms/square, more preferably no greater than about 100 ohms/square, and most preferably from about 5-100 ohms/square. In certain example embodiments, conductivity can be caused by creating nonidealities or point defects in crystal structure of a film to generate electrically active levels thereby causing its sheet resistance to drop significantly into the range discussed above. This can be done by using an oxygen deficient atmosphere during crystal growth and/or by doping (e.g., with Sb).

After the glass substrate 1 with the film thereon exits the tempering furnace, the glass 1 is permitted to cool in a known manner thereby resulting in the thermal tempering thereof and thus a thermally tempered glass substrate 1'. Thus, a thermally tempered glass substrate 1 has been provided with a TCO film 3' thereon. The tempered coated article may then be used in monolithic window applications, oven door applications, IG window unit applications, solar cells, heatable window applications, or the like. The TCO may function as a heatable layer/coating (when voltage is applied thereacross) in certain applications such as heatable window applications, or alternatively may function as a heat or IR blocking layer/coating in applications such as oven doors, or alternatively may function as an electrode in applications such as solar cell applications. In certain example embodiments of this invention, the coated article before and/or after tempering has a visible transmission of at least about 30%, more preferably of at least about 50%, and even more preferably of at least about 70%.

In certain example embodiments of this invention, the amorphous metal oxide film 3 prior to tempering and the crystalline TCO film 3' following tempering may be of or include $SnO_x$:Sb (x may be from about 0.5 to 2, more preferably from about 1 to 2, and sometimes from about 1 to 1.95). The film may be oxygen deficient in certain example embodiments (substoichiometric in certain instances). The Sn and Sb may be co-sputtered in an oxygen inclusive atmosphere (e.g., a mixture of oxygen and argon) to form the amorphous metal oxide film 3 in certain example embodiments of this invention, with the Sb being provided to increase conductivity of the crystalline film following tempering. The co-sputtering to form metal oxide film 3 may be performed by sputtering a ceramic target(s) of $SnSbO_x$ in certain example embodiments of this invention (e.g., in a gaseous atmosphere include argon and/or oxygen gas); or alternatively the co-sputtering may be performed by sputtering a SnSb target(s) in an atmosphere including argon, oxygen and possibly fluorine gases.

In certain example embodiments, the Sb is provided for doping purposes, and can make up from about 0.001 to 30% (weight %) of the amorphous and/or crystalline metal oxide film (from preferably from about 1 to 15%, with an example being about 8%). If the Sb content is higher than this, the lattice is disturbed too much and mobility of electrons is also disturbed thereby hurting conductivity of the film, whereas if less than this amount of Sb is provided then the conductivity is not as good in the crystalline film. In certain example embodiments of this invention, the amorphous 3 and/or crystalline film 3' has a Sn content of from about 20-95%, more preferably from about 30-80%.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

For example, in certain example embodiments an optically and/or mechanically matching layer(s) or layer stack may be provided between the TCO film 3 (or 3') and the glass substrate 1 (or 1'). Moreover, it is possible to form other layer(s) over the film 3 (or 3') in certain example embodiments of this invention. In certain example embodiments, an anti-reflection coating may be provided on top of the layer 3 (or 3'). In other example embodiments of this invention, the Sb may be omitted from film 3 and/or 3', or another dopant(s) may be used instead of or in addition to the Sb in the film.

The invention claimed is:

1. A thermally tempered coated article comprising:
   a thermally tempered glass substrate; and
   a sputter-deposited thermally tempered crystalline transparent conductive film comprising a metal oxide supported by at least the tempered glass substrate, wherein the transparent conductive film comprises Sn and Sb, and has an Sb content of from about 1 to 15%, and wherein a crystal structure of the crystalline transparent conductive film contains at least one of non-idealities and point defects in said crystal structure.

2. The thermally tempered coated article of claim 1, wherein the crystalline transparent conductive film has a sheet resistance of no greater than about 100 ohms/square and a visible transmission of at least about 70%.

3. The thermally tempered coated article of claim 1, wherein the coated article has a visible transmission of at least about 70%.

4. The thermally tempered coated article of claim 1, wherein the crystalline transparent conductive film has an Sb content of about 8%.

5. The thermally tempered coated article of claim 1, wherein the crystalline transparent conductive film has an Sn content of from about 30-80%.

6. The thermally tempered coated article of claim 1, wherein the crystalline transparent conductive film is characterized by $SnO_x$:Sb, where x is from 1 to 1.95.

7. A window comprising the thermally tempered coated article of claim 1, wherein the window is substantially transparent.

* * * * *